(12) United States Patent
Satoh

(10) Patent No.: US 12,712,157 B2
(45) Date of Patent: Aug. 18, 2026

(54) SEMICONDUCTOR MANUFACTURING APPARATUS AND COMPONENT FOR SEMICONDUCTOR MANUFACTURING APPARATUS

(71) Applicant: Tokyo Electron Limited, Tokyo (JP)

(72) Inventor: Naoyuki Satoh, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 426 days.

(21) Appl. No.: 18/367,484

(22) Filed: Sep. 13, 2023

(65) Prior Publication Data

US 2023/0420226 A1 Dec. 28, 2023

Related U.S. Application Data

(63) Continuation of application No. PCT/JP2022/010604, filed on Mar. 10, 2022.

(30) Foreign Application Priority Data

Mar. 23, 2021 (JP) ................................ 2021-048613

(51) Int. Cl.
*H01J 37/32* (2006.01)
*C23C 16/32* (2006.01)

(52) U.S. Cl.
CPC ...... *H01J 37/32504* (2013.01); *C23C 16/325* (2013.01); *H01J 37/3244* (2013.01); *H01J 37/32091* (2013.01)

(58) Field of Classification Search
CPC ............. H01J 37/32504; H01J 37/3244; H01J 37/32091; C23C 16/325

(Continued)

(56) References Cited

U.S. PATENT DOCUMENTS 5,683,028 A * 11/1997 Goela .................. C04B 37/005 228/121
7,009,281 B2 * 3/2006 Bailey, III .......... H10P 72/0431 257/E21.583

(Continued)

FOREIGN PATENT DOCUMENTS

CN 115461851 A * 12/2022 .......... H10P 72/0406
JP S57-007923 U 1/1982

(Continued)

OTHER PUBLICATIONS

International Search Report and Written Opinion mailed on May 24, 2022, received for PCT Application PCT/JP2022/010604, filed on Mar. 10, 2022, 9 pages including English Translation.

*Primary Examiner* — Parviz Hassanzadeh
(74) *Attorney, Agent, or Firm* — XSENSUS LLP

(57) ABSTRACT

Provided is a semiconductor manufacturing apparatus. The semiconductor manufacturing apparatus includes: a processing chamber; a substrate support provided in the processing chamber and configured to hold a substrate; a plate facing the substrate support and having a gas introduction port; and a cylindrical member configured to support the plate and surround a periphery of the substrate. The plate and the cylindrical member constitute a component of a SiC member having a SiC film deposited by CVD, and the cylindrical member includes a first portion that is deformable under a load.

20 Claims, 6 Drawing Sheets

(58) Field of Classification Search
USPC ..................................................... 156/345.51
See application file for complete search history.

(56) References Cited

U.S. PATENT DOCUMENTS

| | | | | |
|---|---|---|---|---|
| 7,972,467 B2 * | 7/2011 | Bera | ..................... | H01J 37/321 118/723 R |
| 2016/0189936 A1 * | 6/2016 | Chia | ................. | C23C 16/45565 156/345.33 |

FOREIGN PATENT DOCUMENTS

| | | | | |
|---|---|---|---|---|
| JP | H10-087376 A | 4/1998 | | |
| JP | 6550198 B1 | 7/2019 | | |
| JP | 2020-506291 A | 2/2020 | | |
| JP | 2020-139207 A | 9/2020 | | |
| TW | 426639 B | 3/2001 | | |
| TW | 201839164 A | 11/2018 | | |
| WO | WO-2018146370 A1 * | 8/2018 | ........... | C23C 16/458 |

* cited by examiner 1
2
2a
2a1
2a2
2a3
10
10a
10e
10s
11
111
111a
111b
112
12
12
13
13a
13b
13c
13d
14
W
20
21
22
30
31
31a
31b
32
32a
32b
40

15
15a
15b

φ2: 0.3 to several mm
13c
14
1 to 30 mm
φ1: 300 to 600 mm 12
10 to 200 mm
φ1: 300 to 600 mm φ3: 200 to 500 mm
112
1 to 10 mm
φ1: 300 to 600 mm III
13c
14
III
3
12

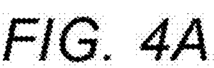
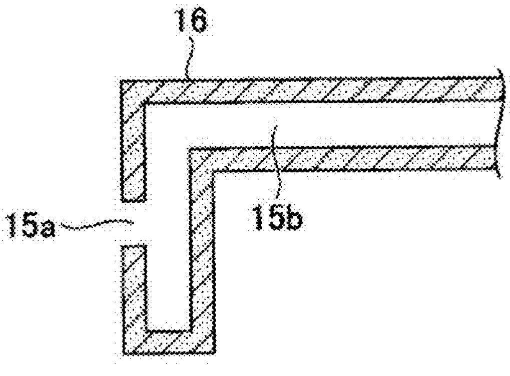
FIG. 4B
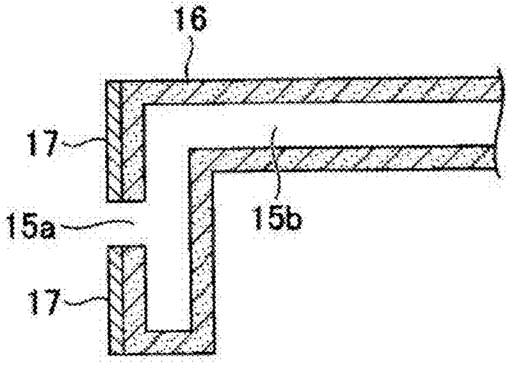
FIG. 4C
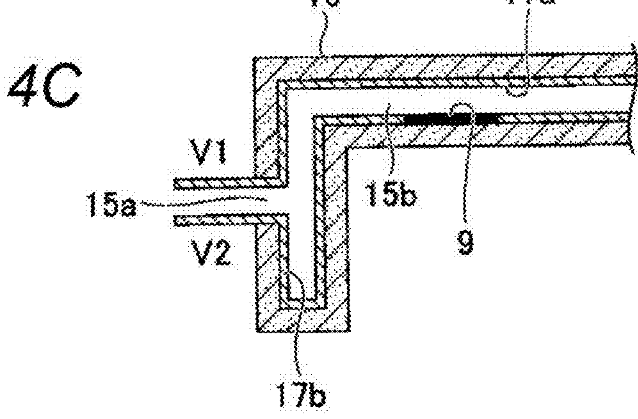
FIG. 4D
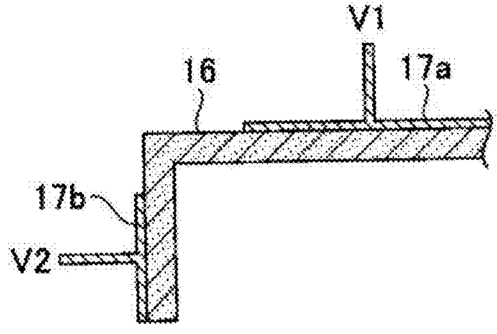

111
115
W
Tf
112f
Tg
112
114
111b
111c
Te
113
113b

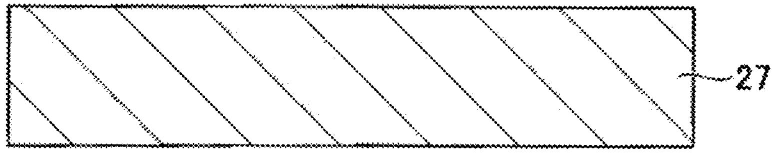
FIG. 6B
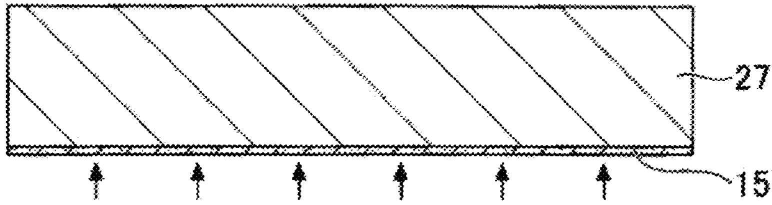
FIG. 6C
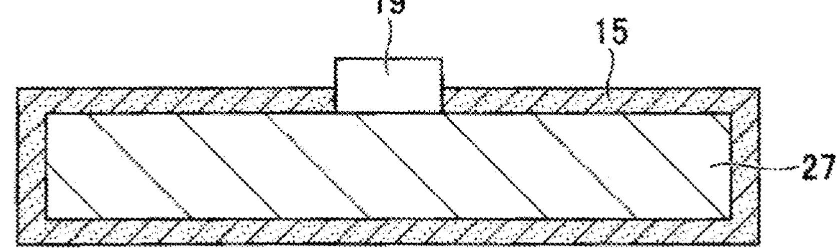
FIG. 6D
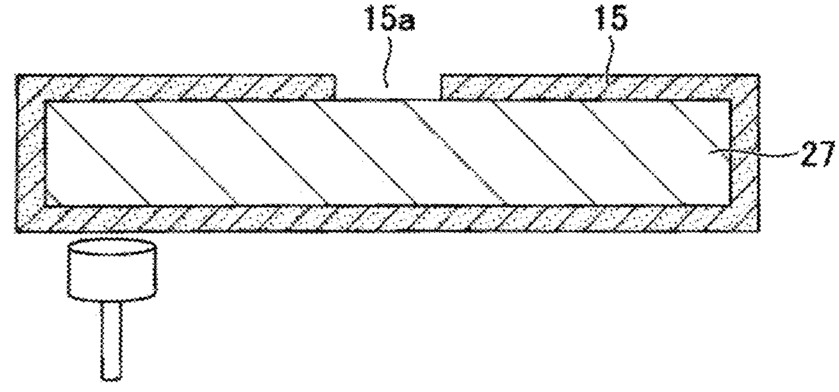
FIG. 6E
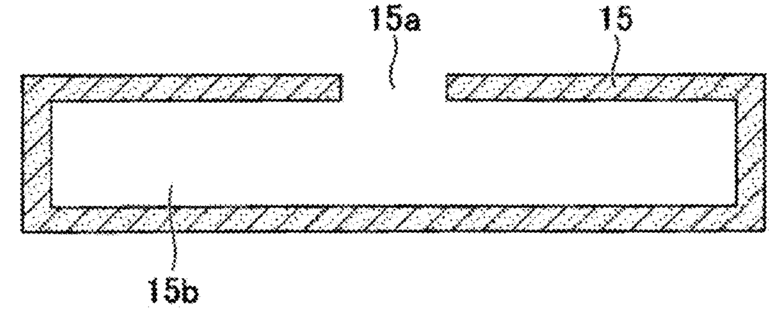

SEMICONDUCTOR MANUFACTURING APPARATUS AND COMPONENT FOR SEMICONDUCTOR MANUFACTURING APPARATUS

CROSS-REFERENCE TO RELATED APPLICATIONS

This application is a bypass continuation application of international application No. PCT/JP2022/010604 having an international filing date of Mar. 10, 2022 and designating the United States, the international application being based upon and claiming the benefit of priority from Japanese Patent Application No. 2021-048613, filed on Mar. 23, 2021, the entire contents of each are incorporated herein by reference.

TECHNICAL FIELD

The present disclosure relates to a semiconductor manufacturing apparatus and a component for a semiconductor manufacturing apparatus.

BACKGROUND

For example, Japanese Laid-open Patent Publication No. S57-7923 proposes a method of manufacturing a silicon single crystal wafer processing receiver only made of a semiconductor material by depositing a coating film of the semiconductor material on a graphite base material by a vapor phase growth method, forming a slit by mechanical processing in a state where the base material remains, and thereafter performing baking-out of the graphite base material.

For example, Japanese Patent No. 6550198 proposes a SiC member in which a SiC film is formed on an outer periphery of a base material by a vapor phase growth film deposition method, and a three-dimensional shape formed by the SiC film is attained by removing the base material.

SUMMARY

The present disclosure provides a technique for making it possible to deform a component for a semiconductor manufacturing apparatus.

According to an aspect of the present disclosure, a semiconductor manufacturing apparatus is provided. The semiconductor manufacturing apparatus includes: a processing chamber; a substrate support provided in the processing chamber and configured to hold a substrate; a plate facing the substrate support and having a gas introduction port; and a cylindrical member configured to support the plate and surround a periphery of the substrate. The plate and the cylindrical member constitute a component of a SiC member having a SiC film deposited by CVD, and the cylindrical member includes a first portion that is deformable under a load.

According to one aspect, it is possible to deform a component for a semiconductor manufacturing apparatus.

BRIEF DESCRIPTION OF THE DRAWINGS

FIGS. 3A and 3B are diagrams illustrating examples of a cross-section taken along a surface III-III in FIG. 2D.

FIGS. 4A to 4D are diagrams illustrating examples of the SiC member according to the embodiment.

FIGS. 6A to 6E are diagrams illustrating an example of a method of manufacturing the SiC member according to the embodiment.

DETAILED DESCRIPTION

Figure 1:
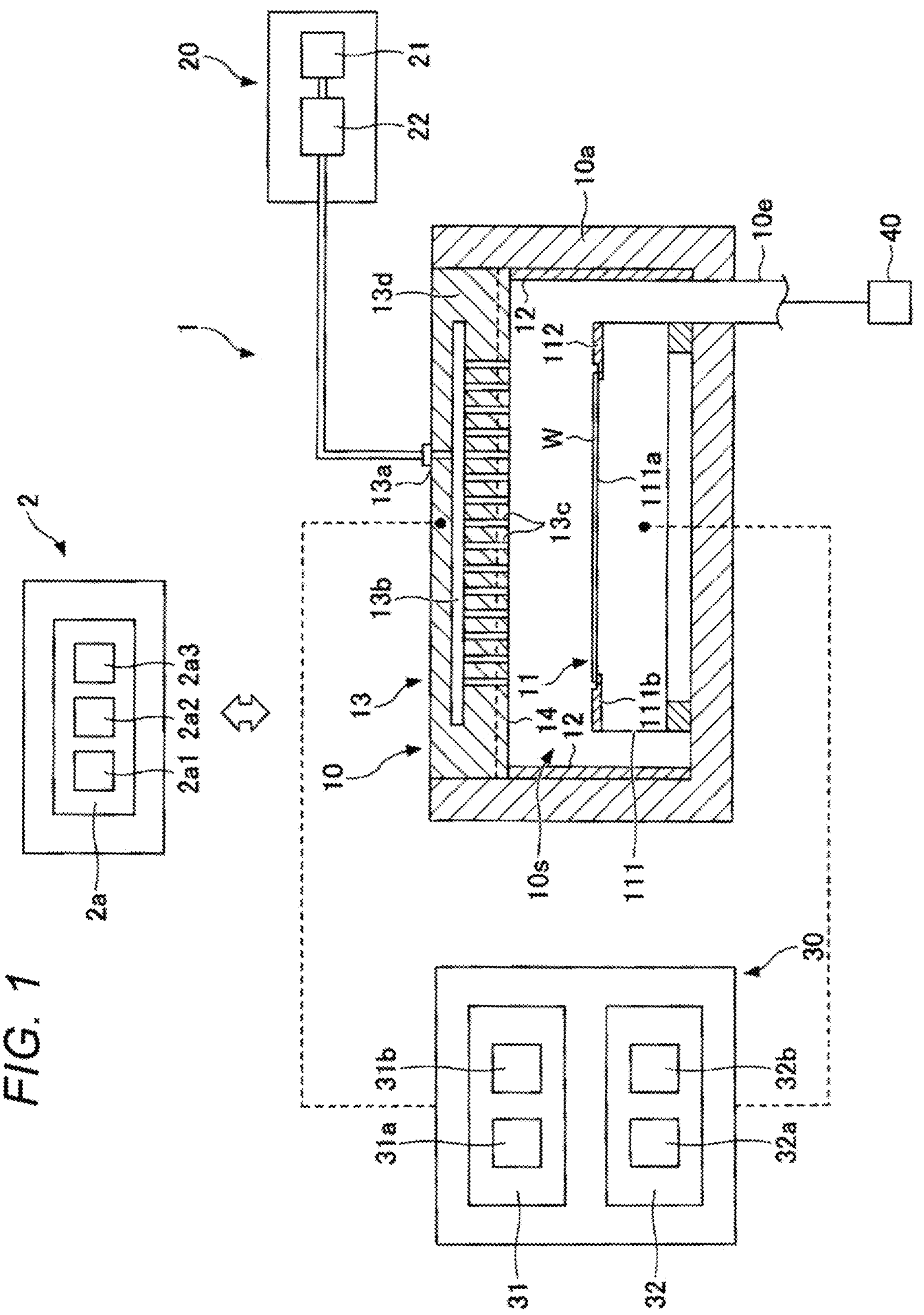
FIG. 1 is a schematic cross-sectional view illustrating an example of a plasma processing system according to an embodiment.

Hereinafter, embodiments for implementing the present disclosure will be described with reference to the drawings. In the respective drawings, the same components will be denoted by the same reference numerals, and overlapping descriptions thereof may be appropriately omitted.

<Plasma Processing System>

Hereinafter, a configuration example of a plasma processing system according to an embodiment will be described with reference to FIG. 1. FIG. 1 is a schematic cross-sectional view illustrating an example of a plasma processing system according to an embodiment.

The plasma processing system includes a capacitively-coupled plasma processing apparatus 1 and a controller 2. The capacitively-coupled plasma processing apparatus 1 is an example of a semiconductor manufacturing apparatus and includes a plasma processing chamber (processing chamber) 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11 and faces the substrate support 11. In one embodiment, the shower head 13 constitutes at least a part of a ceiling of the plasma processing chamber 10. The plasma processing chamber 10 has a plasma processing space 10*s* defined by the shower head 13, a sidewall 10*a* of the plasma processing chamber 10, and the substrate support 11. The plasma processing chamber 10 has at least one gas supply port for supplying at least one processing gas into the plasma processing space 10*s*, and at least one gas exhaust port for exhausting the gas from the plasma processing space 10*s*. The sidewall 10*a* is grounded. The shower head 13 and the substrate support 11 are electrically insulated from a housing of the plasma processing chamber 10.

The substrate support 11 includes a main body 111 and a ring assembly 112. The main body 111 includes a central region (substrate support surface) 111*a* that supports a substrate (wafer) W, and an annular region (ring support surface) 111*b* that supports the ring assembly 112. The annular region 111*b* of the main body 111 surrounds the central region 111*a* of the main body 111 in a plan view. The substrate W is disposed on the central region 111*a* of the main body 111 and the ring assembly 112 is disposed on the annular region 111*b* of the main body 111 to surround the substrate W on the central region 111*a* of the main body 111. In one embodiment, the main body 111 includes a base and an electrostatic chuck. The base includes a conductive member. The conductive member of the base functions as a lower electrode. The electrostatic chuck is disposed on the base. An upper surface of the electrostatic chuck includes the substrate support surface 111*a*. The ring assembly 112 includes one or more annular members. At least one of the one or more annular members is an edge ring. Although not illustrated, the substrate support 11 may include a temperature control module configured to adjust a temperature of at least one of the electrostatic chuck, the ring assembly 112, and the substrate to a target temperature. The temperature control module may include a heater, a heat transfer medium, a flow path, or a combination thereof. A heat transfer fluid, such as brine or gas, flows through the flow path. Further, the substrate support 11 may include a heat transfer gas supply configured to supply a heat transfer gas between a rear surface of the substrate W and the substrate support surface 111*a*.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes a conductive member. The conductive member of the shower head 13 functions as an upper electrode. In addition to the shower head 13, the gas introduction unit may include one or more side gas injectors (SGI) that are attached to one or more openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to the plasma processing chamber 10 via at least one impedance matching circuit. The RF power source 31 is configured to supply at least one RF signal (RF power), such as a source RF signal and a bias RF signal, to the conductive member of the substrate support 11 and/or the conductive member of the shower head 13. Accordingly, plasma is formed from at least one processing gas supplied into the plasma processing space 10*s*. Accordingly, the RF power source 31 may function as at least a part of a plasma generator configured to generate plasma from one or more processing gases in the plasma processing chamber 10. In addition, by supplying the bias RF signal to the conductive member of the substrate support 11, a bias potential can be generated in the substrate W to attract ion components in the generated plasma to the substrate W.

In one embodiment, the RF power source 31 includes a first RF generator 31*a* and a second RF generator 31*b*. The first RF generator 31*a* is coupled to the conductive member of the substrate support 11 and/or the conductive member of the shower head 13 via at least one impedance matching circuit, and is configured to generate a source RF signal (source RF power) for plasma generation. In one embodiment, the source RF signal has a frequency in a range of 13 MHz to 150 MHz. In one embodiment, the first RF generator 31*a* may be configured to generate a plurality of source RF signals having different frequencies. The generated one or more source RF signals are supplied to the conductive member of the substrate support 11 and/or the conductive member of the shower head 13. The second RF generator 31*b* is coupled to the conductive member of the substrate support 11 via at least one impedance matching circuit, and is configured to generate the bias RF signal (bias RF power). In one embodiment, the bias RF signal has a lower frequency than that of the source RF signal. In one embodiment, the bias RF signal has a frequency within a range of 400 kHz to 13.56 MHz. In one embodiment, the second RF generator 31*b* may be configured to generate a plurality of bias RF signals having different frequencies. The generated one or more bias RF signals are supplied to the conductive member of the substrate support 11. In addition, in various embodiments, at least one of the source RF signal and the bias RF signal may be pulsed.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is connected to the conductive member of the substrate support 11, and is configured to generate a first DC signal. The generated first DC signal is applied to the conductive member of the substrate support 11. In one embodiment, the first DC signal may be applied to another electrode such as an electrode in the electrostatic chuck. In one embodiment, the second DC generator 32*b* is connected to the conductive member of the shower head 13, and is configured to generate a second DC signal. The generated second DC signal is applied to the conductive member of the shower head 13. In various embodiments, at least one of the first and second DC signals may be pulsed. The first and second DC generators 32*a* and 32*b* may be provided in addition to the RF power source 31, and the first DC generator 32*a* may be provided instead of the second RF generator 31*b*.

The exhaust system 40 may be connected to, for example, a gas exhaust port 10*e* disposed at a bottom portion of the plasma processing chamber 10. The exhaust system 40 may include a pressure adjusting valve and a vacuum pump. The pressure in the plasma processing space 10*s* is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2*a*. The computer 2*a* may include, for example, a processor (central processing unit (CPU)) 2*a*1, a storage unit 2*a*2, and a communication interface 2*a*3. The processor 2*a*1 may be configured to perform various control operations based on a program stored in the storage unit 2*a*2. The storage unit 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 through a communication line such as a local area network (LAN).

<Component for Semiconductor Manufacturing Apparatus>

Next, a component for a semiconductor manufacturing apparatus according to the present disclosure will be described. FIGS. 2A to 2F illustrate a cylindrical member 12, a plate 14 of the shower head 13, and the ring assembly 112, as examples of the components for a semiconductor manufacturing apparatus according to the present disclosure.

However, the component for a semiconductor manufacturing apparatus according to the present disclosure is not limited thereto.

The cylindrical member 12 is a tubular-shaped (cylindrical) component that covers the sidewall 10*a* (inner wall) of the plasma processing chamber 10. The cylindrical member 12 prevents reaction products generated during plasma processing from adhering to the inner wall of the plasma processing chamber 10. Further, the cylindrical member 12 may be provided at a position where the cylindrical member 12 further covers an outer peripheral sidewall of the substrate support 11. The cylindrical member 12 supports the plate 14 and surrounds a periphery of the substrate W, so that the plasma can be confined around the substrate W.

The plate 14 is a disk-shaped component that constitutes a part including a lower surface of the shower head 13. The plate 14 is supported by the cylindrical member 12 serving as a support. The plurality of gas introduction ports 13*c* penetrate the plate 14 in a thickness direction.

The ring assembly 112 is an annular member and is provided around the substrate W. The cylindrical member 12, the plate 14, and the ring assembly 112 are examples of the component for a semiconductor manufacturing apparatus, and are made of a SiC member deposited by chemical vapor deposition (CVD). The cylindrical member 12, the plate 14, and the ring assembly 112 are provided in the plasma processing chamber 10 in a detachable manner.

The component for the semiconductor manufacturing apparatus is required to have strict criteria for low dust generation and low contamination that do not affect the process within the plasma processing chamber 10. Furthermore, there is a tendency for these criteria to become even more stringent in the further.

For "low dust generation", it is required to select a material easily vaporized in the plasma and having a high vapor pressure of a fluoride compound, and a component having no structural defect such as a crushed layer or a pore on a surface exposed to the plasma is also required.

For "low contamination", it is important that the component does not contain a so-called metal-based element as much as possible. That is, the component does not contain Na, K, Ca, Fe, Ni, Co, Cr, Mn, Mg, Y, Al, and Cu as much as possible, and in particular, a content of Cu is strictly limited. Further, it is important that the surface exposed to the plasma has no structural defect such as a crushed layer and a pore, and that the material has a low density.

Silicon (Si) or SiC is a material capable of achieving low dust generation and low contamination, and SiC is particularly preferable as a material of the component for a semiconductor manufacturing apparatus. SiC is lightweight, inexpensive, and harder than silicon. When SiC is formed into a hollow structure, a thickness thereof can be made as thin as possible. Further, CVD is the best production method, and by depositing a SiC film having a desired thickness by CVD, a SiC member having the SiC film can be formed. Such a SiC member can be applied as the component for a semiconductor manufacturing apparatus with a high mechanical strength, lightweight, deformable, low dust generation and low contamination.

For "replaceability", it is preferable that the SiC member be lightweight, and it is preferable to use SiC, which is a low-density material. Further, it is more preferable to reduce a weight of the SiC member by performing structural modifications such as providing a hollow portion in the SiC member having the SiC film deposited by CVD, and to further attain a function of flowing a heat exchange medium to the hollow portion of the SiC member to adjust a temperature.

For "inexpensive", a cost of the component is largely classified into a raw material cost, a processing cost, and a fixed cost. It is important to reduce a size of the component to reduce the raw material cost, and to shorten a processing time to reduce the processing cost. From the above viewpoints, when the component for a semiconductor manufacturing apparatus is made of the SiC member deposited by CVD, all the requirements of low dust generation, low contamination, replaceability, and low cost can be satisfied. Further, by forming the SiC member deposited by CVD into a hollow structure, the weight can be further reduced. Hereinafter, the SiC member having the SiC film deposited by CVD will also be referred to as a "SiC member".

The SiC member includes a first portion that is deformable under a load, and a thickness of the first portion of the SiC member is 0.05 mm or more and less than 1.0 mm, and more preferably 0.05 mm or more and less than 0.5 mm. The first portion may be a part of the SiC member or the entire of the SiC member. When the first portion is a part of the SiC member, the SiC member may include a second portion that is not deformed under a load, and a thickness of the second portion may be 1.0 mm or less, as long as the thickness of the second portion is larger than the thickness of the first portion.

By forming the SiC member to be deformable under a load, it is possible to stabilize an electric contact or a thermal contact between the SiC member and a peripheral member thereof. For example, when the SiC member is disposed in the plasma processing chamber 10, accuracy of mechanical processing and assembling errors of the SiC member and the peripheral member thereof may cause tilting and deviation, resulting in electric and/or thermal instability at the contact of the SiC member and the peripheral member thereof.

In contrast, in the SiC member according to the present disclosure, a film thickness of the deformable first portion and a film thickness of the second portion other than the deformable first portion are controlled to be different from each other during the film deposition by CVD. According to this configuration, when a load is applied to the SiC member, the SiC member is pressed against the peripheral member by deformation of the first portion, and adhesiveness between the SiC member and the peripheral member is improved by the first portion of the SiC member. Accordingly, it is possible to improve electric and/or thermal stability at the contact between the SiC member and the peripheral member. However, as described above, the component may be implemented by the first portion alone.

Hereinafter, an example of the configuration of the SiC member will be described with reference to FIGS. 2A to 5. However, the SiC member used as the component for a semiconductor manufacturing apparatus is not limited to a SiC member described below. Further, instead of the SiC member, a member having a carbon film or a member having an aluminum film can also be used. The carbon film and the aluminum film are obtained by depositing other materials such as carbon (C) and aluminum (Al) by CVD.

<SiC Member>

Figures 2A, 2B, 2C, 2D, 2E, 2F:
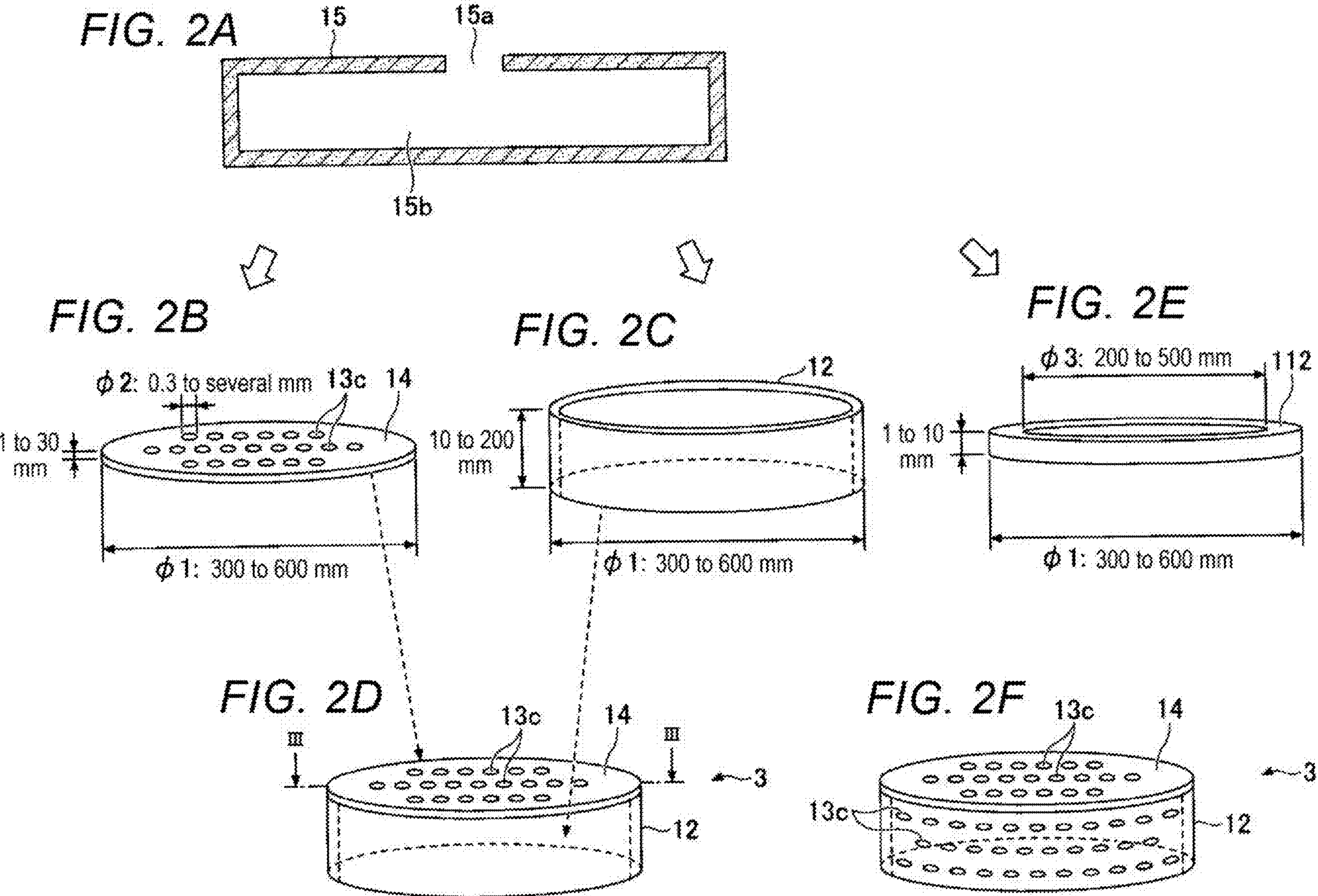
FIGS. 2A to 2F are diagrams illustrating examples of a SiC member according to the embodiment.

FIG. 2A shows an example of a SiC member of a component used in a semiconductor manufacturing apparatus. A SiC member 15 in FIG. 2A has a substantially rectangular cross-section, and has an opening 15*a* formed in an upper portion and an inner hollow portion (space) 15*b*. The opening 15*a* and the hollow portion 15*b* communicate with each other.

The SiC member 15 may have one or more openings 15*a* having a predetermined shape and size. A gas or cooling water can be introduced as a heat exchange medium into the hollow portion 15*b* to perform temperature control. However, the SiC member 15 can also be used without introducing a gas or cooling water into the hollow portion 15*b*.

The SiC member 15 does not need to have the same thickness on the entire surface, and is deposited to have a thickness of 0.05 mm or more and less than 1.0 mm, more preferably 0.05 mm or more and less than 0.5 mm in a portion (the first portion) to be deformed. The SiC member 15 is deposited to have a thickness of 0.5 mm or more and 1.0 mm or less in other portions (the second portion), which is larger than the thickness of the first portion. The second portion may also have a thickness larger than 1.0 mm. However, in a case where the thickness of the second portion is larger than 1.0 mm, for example, about 10 mm, a film deposition time by CVD becomes long, a throughput is reduced, and productivity is reduced. Accordingly, the second portion may have a film thickness of 0.5 mm or more and 1.0 mm or less. In this way, during the film deposition by CVD, the first portion where the SiC member 15 is deformed can be thinned to a thickness of less than 1.0 mm. Further, a surface roughness Ra of an outer surface of the SiC member 15 is preferably 0.01 μm to 20 μm.

The SiC member 15 is not limited to a rectangular shape, and may have other shapes applicable to various components for a semiconductor manufacturing apparatus. Any structure that can be processed can be added to the SiC member, such as a stepped portion, a recess portion, a convex portion, an eave, or a fin, which is necessary.

As a specific example of the SiC member, FIGS. 2B to 2E show the plate 14 of the shower head 13, the cylindrical member 12, an integrated structure of the plate 14 and the cylindrical member 12, and the ring assembly 112, respectively. The plate 14 is an example of the plate of the shower head 13.

The plate 14 in FIG. 2B is manufactured by forming a SiC film having a thickness of 1.0 mm to 30 mm by CVD. The plate 14 is a disk-shaped SiC film having a diameter φ1 of 300 mm to 600 mm. The plurality of gas introduction ports 13*c* each having a diameter φ2 of 0.3 mm to several mm (about 5 mm) penetrate an interior of the plate 14. For example, the diameter φ2 may be 5 mm or less. Further, each of the gas introduction ports 13*c* may be a slit-shaped hole, in addition to a round hole. In this case, a slit width is 1 mm or more, and a length is not particularly limited.

The cylindrical member 12 in FIG. 2C is a cylindrical SiC film formed by CVD, whose diameter φ1 is 300 mm to 600 mm and slightly smaller than a diameter of the sidewall 10*a* of the plasma processing chamber 10, and has an upper surface and a lower surface that are opened. A height of the cylindrical member 12 is 10 mm to 200 mm.

In an integrated structure 3 of the plate 14 and the cylindrical member 12 in FIG. 2D, the upper surface of the cylindrical member 12 is covered with the plate 14. The plate 14 and the cylindrical member 12 have the same diameter. The upper surface of the cylindrical member 12 and an outer peripheral surface of the plate 14 may be integrally molded or may be connected by brazing or the like.

The ring assembly 112 in FIG. 2E is manufactured by forming an annular SiC film by CVD. The ring assembly 112 has an inner diameter (diameter) φ3 of 200 mm to 500 mm, which is slightly larger than a diameter of the substrate W, and an outer diameter (diameter) φ1 of 300 mm to 600 mm. A height of the ring assembly 112 is 1.0 mm to 10 mm. Any SiC member is also deposited to have a thickness of 0.05 mm or more and less than 1.0 mm, more preferably 0.05 mm or more and less than 0.5 mm in a portion (the first portion) to be deformed. The SiC member is deposited to have a thickness larger than the thickness of the first portion, and preferably have a thickness of 0.5 mm or more and 1.0 mm or less in other portions (the second portion).

FIG. 2F is a modification of the integrated structure 3 of the plate 14 and the cylindrical member 12 in FIG. 2D, and holes of the gas introduction ports 13*c* may be additionally formed on a side surface of the cylindrical member 12.

Figures 3A, 3B:
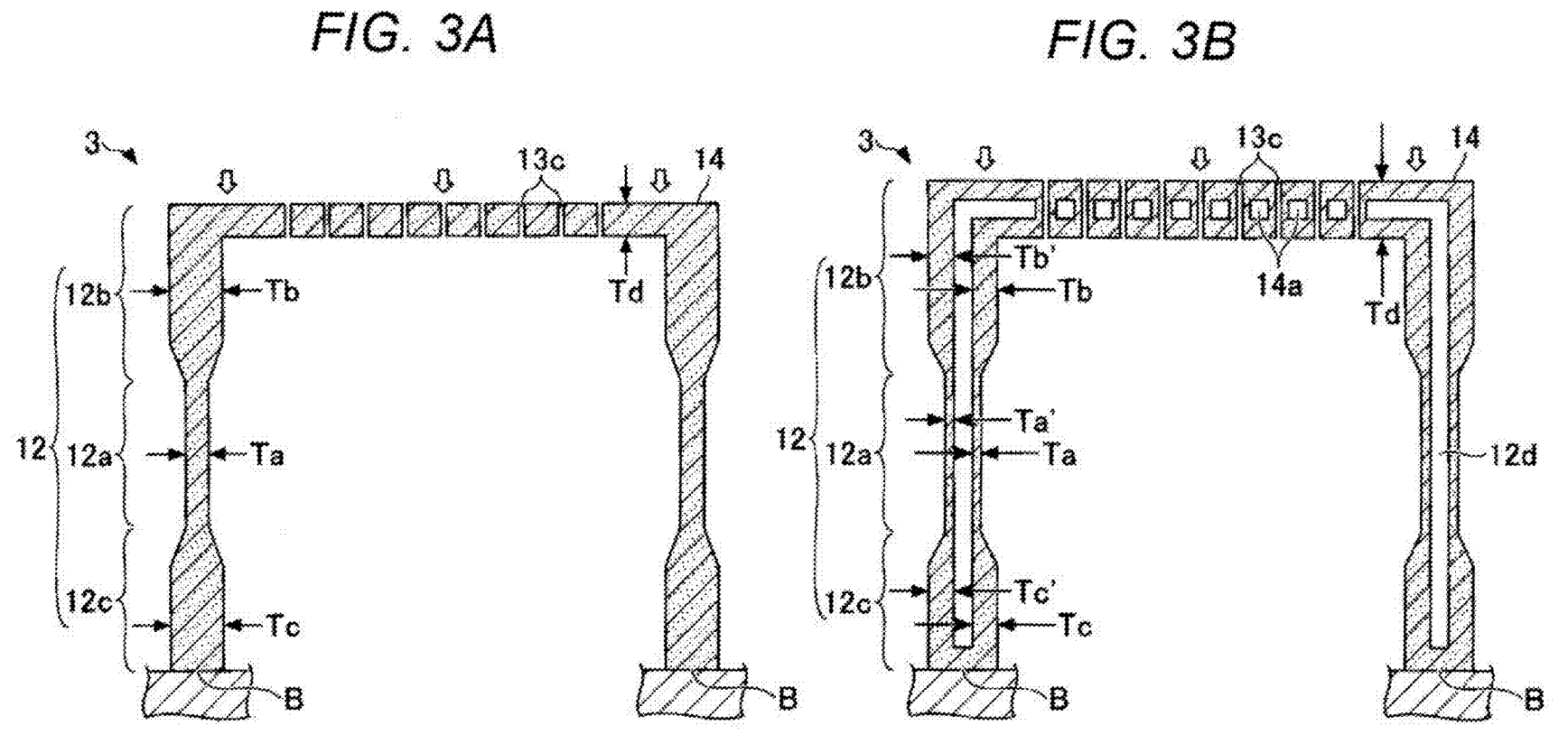

FIGS. 3A and 3B illustrate examples of cross-sections taken along a surface III-III in FIG. 2D. FIGS. 3A and 3B show integrated structures 3 of SiC members, each of which is obtained by integrating the plate 14 and the cylindrical member 12, and in each of the integrated structures 3, a film thickness of a central portion 12*a* of the cylindrical member 12 is small.

The configurations in FIGS. 3A and 3B are different in that the integrated structure 3 of the SiC member in FIG. 3B has hollow portions 14*a* and 12*d* inside, whereas the integrated structure 3 in FIG. 3A does not have such a hollow portion, and are the same in the other configurations.

In FIGS. 3A and 3B, a thickness of the central portion 12*a* of the cylindrical member 12 is smaller than thicknesses of an upper portion 12*b* and a lower portion 12*c* of the cylindrical member 12. In each of the integrated structures 3 of the SiC members, the central portion 12*a* of the cylindrical member 12 is a first portion that is deformable under a load, and a thickness Ta in FIG. 3A is 0.05 mm or more and less than 1.0 mm, more preferably 0.05 mm or more and less than 0.5 mm.

In FIG. 3A, a thickness Tb of the upper portion 12*b* of the cylindrical member 12 and a thickness Tc of the lower portion 12*c* of the cylindrical member 12 may be larger than the thickness of the first portion. For example, the thicknesses Tb and Tc may be 0.5 mm or more and 1.0 mm or less. The upper portion 12*b* and the lower portion 12*c* of the cylindrical member 12 are a second portion that is not deformed under a load. A thickness Td of the plate 14 may be 1 mm or more and 30 mm or less. The plate 14 is a second portion that is not deformed under a load.

The integrated structure 3 of the SiC member can be disposed not only at a bottom of the plasma processing chamber but also on an upper surface of a cover ring 113 (see FIG. 5) to be described later, or the like. In the integrated structure 3, when a load is applied from above to below the plate 14 as shown by arrows in FIGS. 3A and 3B, the central portion 12*a* of the cylindrical member 12 deforms under the load. Due to the deformation of the central portion 12*a*, a bottom of the cylindrical member 12 can be strongly pressed against peripheral members (for example, the bottom of the plasma processing chamber 10 or the upper surface of the cover ring 113) of the cylindrical member 12 to improve the adhesiveness. Accordingly, a contact B can be electrically and/or thermally stabilized. In this way, at least a part of the SiC member is deformable, and thus the SiC member can be deformed under the load. Accordingly, it is possible to stabilize contact with the peripheral member without requiring fastening by a screw or the like. For example, when the contact B in FIGS. 3A and 3B functions as an electric and/or thermal contact, the contact B can be electrically and/or thermally stabilized.

For example, when the plasma processing chamber 10 is set to a ground potential, the contact B functioning as an electric contact can be stabilized. That is, when a load is applied from above to below the plate 14, at least the central portion 12*a* of the cylindrical member 12 is deformed under the load. Due to this deformation, adhesiveness between the SiC member and the plasma processing chamber 10 or the like in the electric contact B is improved. Accordingly, the cylindrical member 12 can be stably controlled to the ground potential.

The integrated structure 3 of the SiC member shown in FIG. 3B has the hollow portions 14*a* and 12*d* inside. The hollow portions 14*a* and 12*d* may be configured to serve as flow paths through which a heat exchange medium such as a gas or cooling water flows.

In this case, the thickness of the central portion 12*a* is a total thickness of an inner thickness Ta (=0.025 mm or more and less than 0.5 mm) and an outer thickness Ta' (=0.025 mm or more and less than 0.5 mm). That is, the thickness of the central portion 12*a* is 0.05 mm (=0.025 mm×2) or more and less than 1.0 mm (=0.5 mm×2).

The thickness of the upper portion 12*b* is a sum of an inner thicknesses Tb (=0.25 mm or more and less than 0.5 mm) and an outer thicknesses Tb' (=0.25 mm or more and less than 0.5 mm), and the thickness of the lower portion 12*c* is a sum of an inner thicknesses Tc (=0.25 mm or more and less than 0.5 mm) and an outer thicknesses Tc' (=0.25 mm or more and less than 0.5 mm). The thicknesses of the upper portion 12*b* and the lower portion 12*c* are 0.5 mm (=0.25 mm×2) or more and 1.0 mm (=0.5 mm×2) or less.

For example, when a heat exchange medium flows through the hollow portions 14*a* and 12*d* in the integrated structure 3, the contact B functioning as a thermal contact can be stabilized. That is, when a load is applied from above to below the plate 14, at least the central portion 12*a* of the cylindrical member 12 is deformed under the load. Due to this deformation, adhesiveness between the SiC member and the plasma processing chamber 10 or the like in the thermal contact B is improved. Accordingly, it is possible to improve heat input from plasma and heat extraction performance when heat is extracted from the integrated structure 3 into the plasma processing chamber 10 or the like.

A component for a semiconductor manufacturing apparatus formed of a ceramic or silicon member is non-deformable and fractures or breaks under a load. In contrast, the SiC member according to the present disclosure has the SiC film deposited by CVD described above, is a structure that can be deformed without being fractured, and is suitable as a component for a semiconductor manufacturing apparatus that also functions as an electric contact or a thermal contact.

That is, a SiC film is formed by CVD such that the film thickness of the deformable first portion is 0.05 mm or more and less than 1.0 mm, and the SiC member according to the present disclosure is made deformable and strong enough not to break. During production, a planar portion of the SiC member may be configured as the deformable first portion having a film thickness of 0.05 mm or more and less than 1.0 mm, and a corner portion of the SiC member may be configured as the non-deformable second portion having a film thickness of 0.5 mm or more and 1.0 mm or less, during the film deposition by CVD. For example, the planar portion is deposited to have a thickness of 0.5 mm by CVD, and the corner portion is deposited to have a thickness of 1.0 mm by CVD, which is twice the thickness of the planar portion.

When a SiC member having the same shape is produced by sintering, the SiC fractures without being deformed when a load is applied to the first portion having a thickness of 0.05 mm or more and less than 1.0 mm. Meanwhile, with a SiC member in which the film thickness of the SiC film in the first portion is controlled to be 0.05 mm or more and less than 1.0 mm by CVD, the SiC member can be deformed and can be prevented from being damaged.

Further, by forming the hollow portions 14*a* and 12*d* inside as shown in FIG. 3B, the weight of the SiC member can be reduced, and replacement of the SiC member can be facilitated. Further, the hollow portions 14*a* and 12*d* are used as the flow paths to flow cooling water or the like for temperature control, or the SiC member such as the cylindrical member 12 is controlled to a desired potential, thereby enabling temperature control and potential control. For example, when the cylindrical member 12 is controlled to a low temperature, the reaction products are likely to adhere, and when the cylindrical member 12 is controlled to a high temperature, the reaction products are less likely to adhere. In addition, when a potential of the cylindrical member 12 is set to a potential with the same polarity as the reaction products in the plasma processing chamber 10, the reaction products are repelled, and when the potential of the cylindrical member 12 is set to a potential opposite in polarity to the reaction products, the reaction products are attracted and more reaction products can adhere to the cylindrical member 12.

As described above, it is preferable that the SiC member be configured to adjust the potential. Further, it is preferable that the SiC member be configured to adjust the temperature.

FIGS. 4A to 4D are enlarged views of a part of the SiC member. FIGS. 4B to 4D illustrate examples of a SiC member 16 configured to adjust the potential and/or the temperature. The SiC member 16 shown in FIG. 4A has an opening 15*a* and a hollow portion 15*b* formed in the SiC member 16, and the opening 15*a* and the hollow portion 15*b* communicate with each other. A heat exchange medium can flow through the hollow portion 15*b*. The SiC member 16 made of the SiC film deposited by CVD has a relatively low resistivity (several Ωcm), and thus the potential can be controlled when a potential is directly applied to the SiC member 16. However, problems such as potential deviations or heat generation may occur in the SiC member 16.

Therefore, as shown in FIGS. 4B to 4D, it is preferable that the SiC member 16 include a conductive film 17 having high resistance to the SiC film, and be configured to adjust the potential. In FIG. 4B, the conductive film 17 is deposited on a surface of the SiC film and is used as a contact with a peripheral member, and a potential is applied to the conductive film 17 as the contact. A heat exchange medium can flow through the hollow portion 15*b*.

As shown in FIG. 4C, conductive films 17*a* and 17*b* having high resistance may be deposited on an inner surface of the SiC film of the SiC member 16, the conductive films 17*a* and 17*b* may be exposed from the opening 15*a* to provide contacts with a peripheral member, and a potential may be applied to the contacts. The conductive films 17*a* and 17*b* are insulated by an insulating film 9. Accordingly, different potentials V1 and V2 can be applied to the conductive films 17*a* and 17*b* exposed from the opening 15*a*, respectively. Accordingly, the SiC member 16 can be controlled to the different potentials V1 and V2. For example, the conductive film 17*a* can be controlled to a low potential, the conductive film 17*b* can be controlled to a high potential, and control variations can be increased. In the SiC member 16 in FIG. 4C, a heat exchange medium can also flow through the hollow portion 15*b*. Further, a current can flow through the conductive films 17*a* and 17*b* in the hollow portion 15*b*. The conductive films 17*a* and 17*b* may be semiconductors. Accordingly, it is possible to apply a potential to the conductive films 17*a* and 17*b* or the semiconductor.

As shown in FIG. 4D, the SiC member (SiC film) 16 that does not have the hollow portion 15*b* may be formed by CVD, the conductive films 17*a* and 17*b* having high resistance may be deposited on a surface of the SiC member (SiC film) 16, and different powers may be applied to the conductive films 17*a* and 17*b*. Accordingly, the conductive films 17*a* and 17*b* can be controlled to the different potentials V1 and V2. The conductive films 17*a* and 17*b* in FIGS. 4B to 4D may be semiconductors.

By applying the conductive films 17, 17*a*, and 17*b* shown in FIGS. 4B to 4D to the SiC member 16, potential deviations or heat generation in the SiC member 16 can be avoided, and the SiC member 16 can be stably controlled to a desired potential. Further, the conductive films 17, 17*a*, and 17*b* shown in FIGS. 4B to 4D can be used as heater electrode patterns, and may be configured to adjust the temperature. In this case, by applying a potential to the conductive films 17, 17*a*, and 17*b*, the temperature to be controlled for each of the conductive films 17, 17*a*, and 17*b* can be varied.

In the SiC member 16 in FIG. 4C, the conductive films 17*a* and 17*b* can be simultaneously controlled to different temperatures and different potentials. Meanwhile, in the SiC member 16 in FIG. 4D, it may not be possible to control the conductive films 17*a* and 17*b* at different temperatures and different potentials. Therefore, in the configuration of the SiC member 16 in FIG. 4D, whether the conductive films 17*a* and 17*b* of the SiC member 16 are controlled to the different potentials V1 and V2 or to different temperatures is distinguished.

When the conductive films 17*a* and 17*b* are provided on the inner surface of the SiC member 16, any production method capable of depositing the conductive films 17*a* and 17*b* on the inner side of the SiC film of the SiC member 16 in FIG. 4C can be used. For example, a method of depositing a SiC film on the conductive films 17*a* and 17*b* having a high melting point by CVD after depositing the conductive films 17*a* and 17*b* in the SiC member 16 may be considered.

Figure 5:
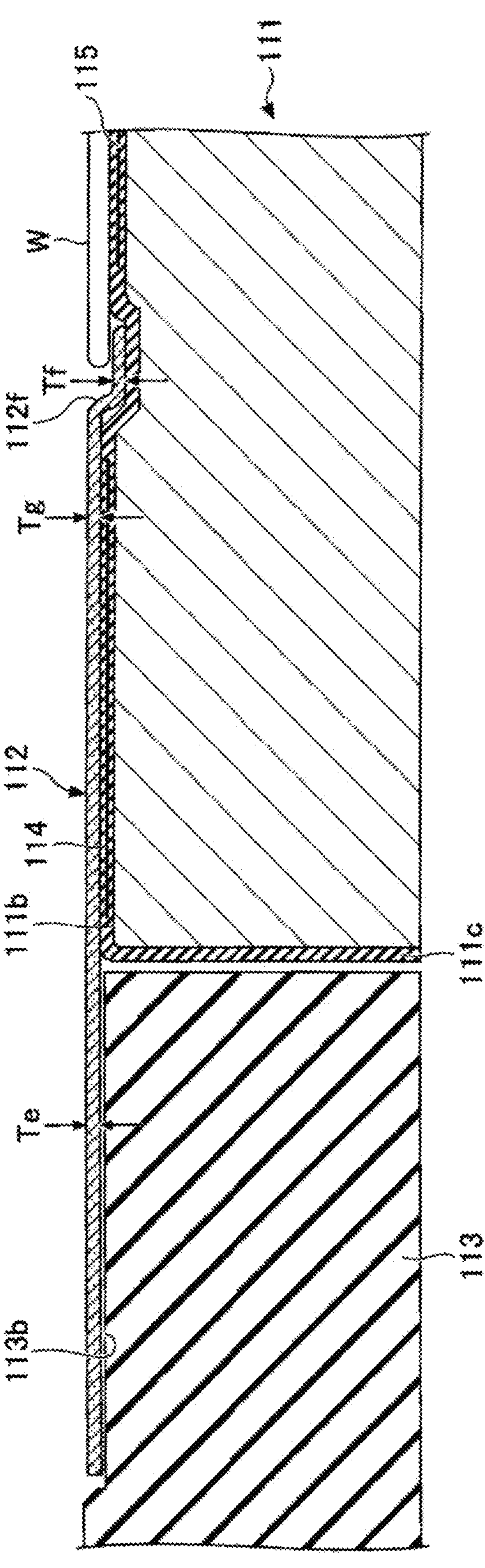
FIG. 5 is a diagram illustrating an example of the SiC member according to the embodiment.

FIG. 5 illustrates another example of the SiC member which is a component for a semiconductor manufacturing apparatus according to one embodiment. FIG. 5 illustrates the ring assembly 112 formed of the SiC film formed by CVD as an example of the SiC member. FIG. 5 is an enlarged view of a part (outer periphery) of the main body 111 on which the ring assembly 112 is placed, which is an outer periphery of the substrate W.

The ring assembly 112 is placed on the ring support surface 111*b* that supports the ring assembly 112, which is the outer periphery of the substrate W. More specifically, the main body 111 is formed of aluminum, and a surface thereof is covered with a sprayed alumina thermal spray film 111*c*. The annular cover ring 113 made of quartz is disposed on the outer periphery of the main body 111. The ring assembly 112 is placed on the annular region (ring support surface) 111*b* of the main body 111 and a ring support surface 113*b* of the cover ring 113.

A substrate electrode 115 is disposed inside the thermal spray film 111*c* below the substrate W, and an electrode 114 for the ring assembly 112 is disposed inside the thermal spray film 111*c* below the ring assembly 112. The electrodes 114 and 115 are made of a metal such as tungsten. Each of the substrate electrode 115 and the electrode 114 for the ring assembly 112 may be an attraction electrode that electrostatically attracts the substrate W and the ring assembly 112, or may be a heater electrode that controls temperatures of the substrate W and the ring assembly 112. Here, each of the substrate electrode 115 and the electrode 114 for the ring assembly 112 will be described as an attraction electrode.

In a case where a thickness Tg of the ring assembly 112 on the electrode 114 is deformed when a direct-current voltage is applied to the electrode 114 and the ring assembly 112 is electrostatically attracted to the main body 111, adhesiveness between a lower surface of the ring assembly 112 and an upper surface of the main body 111 is improved, and an attraction force therebetween is increased. Therefore, the thickness Tg of the ring assembly 112 on the electrode 114 is reduced in a deformable manner. That is, the portion of the ring assembly 112 on the electrode 114 is the deformable first portion, and the thickness Tg of this portion is 0.05 mm or more and less than 1.0 mm.

Meanwhile, other portions of the ring assembly 112 may have a non-deformable thickness. For example, a thickness Te of the ring assembly 112 on the cover ring 113 may be a non-deformable thickness of 0.5 mm or more and 1.0 mm or less, or may be a deformable thickness of 0.05 mm or more and less than 1.0 mm. Similarly, a thickness Tf of a portion digging into an edge of the substrate W by a stepped portion 112*f* on an inner side of the ring assembly 112 may be a non-deformable thickness or a deformable thickness. The expression "non-deformable thickness of 0.5 mm or more and 1.0 mm or less" means that such a thickness substantially does not deform, and indicates a tendency that the deformation is more likely to occur as the thickness is closer to 0.5 mm.

<Production Method of SiC Member>

Next, an example of a production method of the SiC member according to the present disclosure will be described with reference to FIGS. 6A to 6E. First, as shown in FIG. 6A, graphite is processed into a desired shape and a desired surface roughness Ra to obtain a base 27. A shape of the base 27 is not limited. The base 27 is not limited to graphite, and may be a material such as silicon that can be removed by heating or chemicals. In this example, the base 27 of graphite is used.

Next, as shown in FIG. 6B, a SiC film 15' is deposited to a desired thickness by CVD, and the base 27 is coated. For example, the SiC film 15' is deposited by CVD using the plasma processing apparatus 1 in FIG. 1, and the SiC film 15' is deposited to a desired thickness to produce the SiC member 15. For example, the SiC member 15 may be produced by depositing the SiC film 15' to a desired thickness by a plasma CVD apparatus or a thermal CVD apparatus. The SiC film 15' may be deposited to have a desired thickness of 0.05 mm or more and less than 1.0 mm in a deformable portion, and may be deposited to have a thickness of 0.5 mm or more and 1.0 mm or less in a non-deformable portion.

As shown in FIG. 6C, the base 27 of graphite may be provided with one or more holding portions 19 of the base 27. Each of the holding portions 19 of the base 27 can be converted into an introduction portion for a heat exchange medium. However, the introduction portion for a heat exchange medium may be formed in a later step.

When a SiC film is deposited on a surface of the base 27 by CVD, a SiC member shown in FIG. 6C is formed. The SiC film may be deposited by a CVD method, but is not limited to this. The SiC film may be deposited by a vacuum vapor deposition type physical vapor deposition (PVD) method, or may be deposited by a molecular beam epitaxy (MBE) method.

Next, as shown in FIG. 6D, a surface of the deposited SiC member 15 is processed to have a surface roughness Ra of 0.01 μm to 20 μm by surface processing. Further, the holding portion 19 of the base 27 is removed.

Next, as shown in FIG. 6E, the base 27 on which the SiC member 15 of the SiC film is formed is heated in a high-temperature oxidizing atmosphere to remove the base 27. When the base 27 is made of graphite as in the production method according to the present disclosure, the base 27 disappears as carbon dioxide and becomes the hollow portion 15*b*. Accordingly, the SiC member 15 is obtained.

As described above, according to the component for a semiconductor manufacturing apparatus according to the present embodiment, the first portion of the SiC member constituting the component has a thickness of 0.05 mm or more and less than 1.0 mm, more preferably 0.05 mm or more and less than 0.5 mm by forming the SiC film by CVD. Accordingly, deformation can be enabled by the first portion of the component for a semiconductor manufacturing apparatus.

As the component according to the present disclosure, the SiC member can maintain an environment inside the plasma processing chamber 10 in a state of low dust generation and low contamination by, for example, disposing the integrated structure 3 of the plate 14 and the cylindrical member 12 shown in FIG. 2D in the plasma processing chamber 10 in a replaceable manner. The SiC member can be applied to a semiconductor manufacturing apparatus as the plate of the shower head, the cylindrical member, and the ring assembly 112, in addition to the integrated structure 3 of the plate of the shower head and the cylindrical member. The SiC member may be the cover ring 113 formed of the SiC film deposited by CVD. When the main body 111 is vertically movably disposed, the SiC member formed of the SiC film deposited by CVD may be applied to a bellows that is attached to a lower portion of the main body 111 and that separates an atmospheric state outside the plasma processing chamber 10 and a vacuum state inside the plasma processing chamber 10.

The semiconductor manufacturing apparatus and the component for a semiconductor manufacturing apparatus according to the embodiments disclosed herein are illustrative and should not be construed as being limited in all aspects. Various modifications and improvements can be made to the embodiments without departing from the spirit and scope of the appended claims. The aspects disclosed in the above embodiments also can have the other configurations to the extent not conflict, and can be combined with each other to the extent not conflict.

The semiconductor manufacturing apparatus according to the present disclosure can be applied to any type of apparatus including an atomic layer deposition (ALD) apparatus, a capacitively coupled plasma (CCP), an inductively coupled plasma (ICP), a radial line slot antenna (RLSA), an electron cyclotron resonance plasma (ECR), and a helicon wave plasma (HWP). The components for a semiconductor manufacturing apparatus according to the present disclosure can be used for any type of the apparatus described above.

Although a plasma processing apparatus has been described as an example of the semiconductor manufacturing apparatus, the semiconductor manufacturing apparatus is not limited to the plasma processing apparatus as long as the semiconductor manufacturing apparatus is a substrate processing apparatus that performs predetermined processing (for example, film deposition processing or etching processing) on a substrate.

The invention claimed is:

1. A semiconductor manufacturing apparatus comprising:
- a processing chamber;
- a substrate support provided in the processing chamber and configured to hold a substrate;
- a plate facing the substrate support and having a gas introduction port; and
- a cylindrical member configured to support the plate and surround a periphery of the substrate, wherein
- the plate and the cylindrical member constitute a component of a SiC member having a SiC film deposited by CVD, and
- the cylindrical member includes a first portion that is deformable under a load.

2. The semiconductor manufacturing apparatus according to claim 1, wherein
- the component of the SiC member is an integrated structure of the plate and the cylindrical member.

3. The semiconductor manufacturing apparatus according to claim 1, wherein
- the SiC member has a hollow portion inside.

4. The semiconductor manufacturing apparatus according to claim 1, wherein
- a thickness of the first portion of the SiC member is 0.05 mm or more and less than 1.0 mm.

5. The semiconductor manufacturing apparatus according to claim 4, wherein
- the thickness of the first portion of the SiC member is 0.05 mm or more and less than 0.5 mm.

6. The semiconductor manufacturing apparatus according to claim 1, wherein
- the SiC member includes a second portion that is not deformed under a load, and a thickness of the second portion is larger than a thickness of the first portion.

7. The semiconductor manufacturing apparatus according to claim 6, wherein
- the thickness of the second portion of the SiC member is 1.0 mm or less.

8. A plasma processing apparatus comprising:
- a plasma processing chamber;
- a substrate support disposed in the plasma processing chamber; and
- a SiC member disposed in the plasma processing chamber,
- wherein the SiC member comprises:
  - a shower plate portion disposed above the substrate support; and
  - a cylindrical portion surrounding the substrate support,
- wherein the cylindrical portion has a hollow structure and is deformable under a load.

9. The plasma processing apparatus according to claim 8, wherein the cylindrical portion comprises:
- an upper portion having a first thickness;
- an intermediate portion having a second thickness; and
- a lower portion having a third thickness, and
- wherein the second thickness is less than the first thickness and the third thickness.

10. The plasma processing apparatus according to claim 9,
- wherein the second thickness is 0.05 mm or more and less than 1.0 mm.

11. The plasma processing apparatus according to claim 10,
- wherein the first thickness and the third thickness are 1.0 mm or less.

12. The plasma processing apparatus according to claim 9, wherein the first thickness is equal to the third thickness.

13. The plasma processing apparatus according to claim 9, wherein the intermediate portion is deformable under a load, and wherein the upper portion and the lower portion is not deformable under a load.

14. The plasma processing apparatus according to claim 8, wherein the shower plate portion has a hollow structure.

15. A substrate processing apparatus comprising:

a chamber;

a substrate support disposed in the chamber; and a member disposed in the chamber, wherein the member comprises:

a shower plate portion disposed above the substrate support; and a cylindrical portion surrounding the substrate support, and wherein the cylindrical portion has a hollow structure and is deformable under a load.

16. The substrate processing apparatus according to claim 15, wherein the cylindrical portion comprises:

an upper portion having a first thickness;

an intermediate portion having a second thickness; and a lower portion having a third thickness, and wherein the second thickness is less than the first thickness and the third thickness.

17. The substrate processing apparatus according to claim 16, wherein the second thickness is 0.05 mm or more and less than 1.0 mm.

18. The substrate processing apparatus according to claim 16, wherein the first thickness and the third thickness are 1.0 mm or less.

19. The substrate processing apparatus according to claim 16, wherein the first thickness is equal to the third thickness.

20. The substrate processing apparatus according to claim 15, wherein the shower plate portion has a hollow structure.

* * * * *